United States Patent
Nakao

(10) Patent No.: US 6,284,387 B1
(45) Date of Patent: Sep. 4, 2001

(54) METHOD FOR THE PREPARATION OF POLYMER-METAL CLUSTER COMPOSITE

(75) Inventor: Yukimichi Nakao, Tsukuba (JP)

(73) Assignee: Agency of Industrial Science and Technology, Tokyo-to (JP)

( * ) Notice: Subject to any disclaimer, the term of this patent is extended or adjusted under 35 U.S.C. 154(b) by 0 days.

(21) Appl. No.: 09/514,097

(22) Filed: Feb. 28, 2000

(30) Foreign Application Priority Data

Mar. 10, 1999 (JP) .................................................. 11-063033

(51) Int. Cl.$^7$ ...................................................... B32B 15/04
(52) U.S. Cl. ......................... 428/457; 428/458; 428/460; 428/461
(58) Field of Search .................................. 428/457, 458, 428/460, 461

(56) References Cited

U.S. PATENT DOCUMENTS

| | | |
|---|---|---|
| 4,981,886 | 1/1991 | Nako et al. . |
| 5,096,737 | 3/1992 | Baum . |
| 5,405,906 | 4/1995 | Olsen et al. . |

FOREIGN PATENT DOCUMENTS

| | | |
|---|---|---|
| 0204950 | 12/1986 | (EP) . |
| 07082410 | 3/1995 | (EP) . |

OTHER PUBLICATIONS

Journal of Materials Science Letters, vol. 10, (1991), pp. 477–479.

Japanese Patent Abstract 5–47587, pp. 177–179.

Japanese Journal of Applied Physics, vol. 33, (1994), Part 2, No. 3A, pp. L331–L333, Novel Preparation Method of Metal Particles Dispersed in Polymer Films and Their Third-Order Optical Nonlinearities by Obawa et al.

Journal of Materials Science Letters, vol. 10 (1991), pp. 477–479, Novel method to disperse ultrafine metal particles into polymer, by Noguchi et al.

*Primary Examiner*—Edward J. Cain
(74) *Attorney, Agent, or Firm*—Dougherty & Troxell

(57) ABSTRACT

Disclosed is a method for the preparation of a polymer-metal cluster composite material having usefulness as a non-linear optical material or high-modulus material. The method comprises bringing a polymeric resin into contact with vapor of a heavy metal compound such as an acetylacetonato complex compound of palladium, platinum or copper under a non-oxidizing atmosphere at a temperature higher than the glass transition temperature of the polymeric resin so that the metal compound vapor is dissolved into the polymeric resin in a glassy state and is in situ reduced into the form of an elementary metal forming clusters of the metal particles.

8 Claims, No Drawings

METHOD FOR THE PREPARATION OF POLYMER-METAL CLUSTER COMPOSITE

BACKGROUND OF THE INVENTION

The present invention relates to a novel method for the preparation of a polymer-metal cluster composite having usefulness as a material of non-linear optical materials and high elastic modulus materials. More particularly, the invention relates to a method for the preparation of a polymer-metal cluster composite in a single step from a polymeric compound and a heavy metal compound as the starting materials.

The so-called polymer- or glass-metal cluster composite, which is a composite body consisting of a polymeric compound or a glassy material as the matrix phase in which a heavy metal is finely and uniformly dispersed as the dispersed phase, has a non-linear optical property or a high-modulus property or is colored with stability so that the composite material is highlighted in recent years as a non-linear optical material, high-modulus material and decorative material.

It is, however, not a simple matter to uniformly disperse very fine particles of a heavy metal in the matrix phase in the form of clusters. Various proposals and attempts are made heretofore to solve this difficult problem. For example, Japanese Patent Publication 5-47587 discloses a method in which a compound of gold, silver or palladium is dissolved in a monomeric liquid compound to form a solution which is subjected to polymerization of the monomeric compound followed by a heat treatment. Japanese Journal of Applied Physics, volume 33 (1994), pages L331–L333, discloses a method in which a polymeric compound and a compound of gold or silver are dissolved together in an organic solvent to form a solution which is subjected to evaporation of the organic solvent to dryness followed by a heat treatment. Further, Journal of Materials Science, Letters, volume 10 (1991), pages 477–479 teaches a method in which gold, silver or copper is vapor-deposited on the surface of a polymeric resinous body followed by a heat treatment.

SUMMARY OF THE INVENTION

The present invention has an object, in view of the above described situations in the prior art, to provide an efficient method for the preparation of a polymer-metal cluster composite in a simple process from readily available inexpensive starting materials.

Thus, the method of the present invention for the preparation of a polymer-metal cluster composite comprises the steps of:

(a) heating and keeping a polymeric compound at a temperature higher than the glass transition temperature thereof, preferably, by at least 5° C.; and (b) bringing a heavy metal compound in the form of vapor into contact with the polymeric compound kept at a temperature higher than the glass transition temperature thereof, preferably, in an atmosphere of a non-oxidizing gas.

DETAILED DESCRIPTION OF THE PREFERRED EMBODIMENTS

In the above described method of the invention, a heavy metal compound in the form of vapor is brought into contact with a polymeric resin kept at an elevated temperature so that the metal compound is dissolved into the polymeric resin where the metal compound is subjected to an in situ reducing reaction to form clusters of fine metal particles. It is essential that the polymeric resin is in a glassy state at the treatment temperature so that the polymeric resin should have a glass transition temperature preferably in the range from 30 to 200° C. In order to facilitate in situ conversion of the metal compound into the elementary form, it is important that the polymeric compound has a reducing activity to the metal compound.

Examples of polymeric compounds to meet these requirements include polyamide resins such as nylon 6 and nylon 66, polyester resins such as polyethylene terephthalate and polybutylene terephthalate and polymers of an unsaturated hydrocarbon monomer such as polystyrene and polypropylene as well as other synthetic resins such as polyvinyl alcohol, polycarbonate and epoxy resins. Semi-synthetic resins such as cellulose acetate derived from a natural polymer can also be used.

Since the heavy metal compound is brought into contact with the polymeric resin in the form of vapor, it is important that the metal compound is readily sublimated or evaporated into vapor. Suitable heavy metal compounds, including complex compounds, are exemplified by the compounds of iron, ruthenium, osmium, cobalt, rhodium, nickel, palladium, platinum, copper, silver and gold such as:

tetracarbonyl($\eta$-methyl acrylate)iron(0) sublimable under $10^{-2}$ mmHg, tricarbonyl($\eta$-1,3-cyclohexadiene)iron(0) boiling at 50–66° C. under 1 mmHg, tricarbonyl($\eta$-cyclobutadiene)iron(0) boiling at 47° C. under 3 mmHg, ($\eta$-cyclopentadienyl)($\eta$-formylcyclopentadienyl)iron(II) sublimable at 70° C. under 1 mmHg, allyltricarbonylcobalt(I) boiling at 39° C. under 15 mmHg, nonacarbonyl(methylidyne)tricobalt sublimable at 50° C. under 0.1 mmHg, dicarbonyl($\eta$-pentamethylcyclopentadienyl)rhodium(I) sublimable at 80–85° C. under 10–20 mmHg, pentahydridobis(trimethylphosphine)iridium(V) sublimable at 50° C. under 1 mmHg, ($\eta$-allyl) ($\eta$-cyclopentadienyl)nickel(II) boiling at 50° C. under 0.45 mmHg, tris($\eta$-cyclopentadienyl)[$\mu_3$-(2,2-dimethylpropylidyne)]-trinickel sublimable at 115–120° C. under 1 mmHg, ($\eta$-allyl)($\eta$-cyclopentadienyl)platinum(II) sublimable at 25° C. under 0.01 mmHg, chloro(trans-cyclooctene)gold(I) boiling at 115° C. , and chloro(cyclohexene)gold(I) boiling at 60° C.

Particularly preferable heavy metal compounds are acetylacetonato complexes of the metal such as:

bis(acetylacetonato)palladium(II) sublimable at 160° C. under 0.1 mmHg, bis(acetylacetonato)platinum(II) sublimable at 170° C., and bis(acetylacetonato)copper(II) sublimable at 65–110° C. under 0.02 mmHg, because these compounds can be converted into vapor without thermal decomposition.

The amount of the metal compound brought into contact with the polymeric resin is such that the resultant polymer-metal cluster composite contains from 0.01 to 40 parts by weight or, preferably, from 0.1 to 2 parts by weight of the metal in the elementary form per 100 parts by weight of the solid polymeric resin. The atmosphere in which the metal compound is brought into contact with the polymeric resin should be formed with a non-oxidizing gas such as nitrogen and argon containing oxygen in a partial pressure not exceeding 1 mmHg. The pressure of the atmosphere is not particularly limitative and can be normal, subatmospheric or superatmospheric.

It is essential that the metal compound in the form of vapor is brought into contact with the polymeric resin kept at a temperature of the glass transition point of the polymer or higher. When the temperature of the polymeric resin is too low, the metal compound vapor cannot be smoothly dissolved into the polymeric resin which is not in a glassy state.

Though dependent on the contacting temperature, the contacting time of the metal compound vapor with the polymeric resin is selected usually in the range from 10 minutes to 5 hours. When the metal compound is a platinum compound or a copper compound, it is preferable that completion of the contacting treatment is followed by a heat treatment for 10 minutes to 50 hours at a temperature in the range from 80 to 250° C. in order to complete formation of the metal clusters. The amount of metal clusters contained in the polymer-metal cluster composite can be increased by extending the time of this post-contacting heat treatment.

In the following, the method of the present invention is described in more detail by way of Examples.

EXAMPLE 1

A 12 mm by 19 mm wide nylon 6 resin sheet of 0.135 mm thickness (a product by Mitsubishi Engineering Plastics Co.) having a glass transition point of 40 to 45° C. was put on the bottom of a flatbottom glass vessel, of which the inner side wall was bearing a layer of bis(acetylacetonato)palladium (II) formed by condensation of vapor of 0.050 mmole of the metal compound. The glass vessel was then flushed and filled with nitrogen gas.

Thereafter, the glass vessel as a whole was immersed in an oil bath at a temperature of 180° C. and kept therein for 30 minutes so that the palladium compound was sublimated and the vapor was brought into contact with the upper surface of the nylon sheet on the vessel bottom. The thus obtained nylon sheet, which was black in color, contained 1.2% by weight of palladium. The composite nylon sheet was examined on an electron microscope to find uniform dispersion of palladium clusters having an average particle diameter of 4.3 nm.

EXAMPLE 2

The experimental procedure was substantially the same as in Example 1 excepting for replacement of the nylon 6 sheet with a 12 mm by 19 mm wide polyethylene terephthalate resin sheet of 0.35 mm thickness (a product by Diafoil Hoechst Co.) having a glass transition point of 70 to 80° C.

The thus obtained polyethylene terephthalate sheet, which was brownish black in color, contained 0.2% by weight of palladium. The electron microscopic examination of the sheet indicated that the sheet contained uniform dispersion of palladium clusters having an average particle diameter of 3.9 nm.

EXAMPLE 3

The experimental procedure was about the same as in Example 1 excepting for replacement of the nylon sheet with a 12 mm by 19 mm wide cured epoxy resin sheet of 0.5 mm thickness prepared from Epikote 828 admixed with 5% by weight of triethylenetetramine.

The thus obtained brownish black resin sheet contained 0.5% by weight of palladium. The electron microscopic examination of the sheet indicated that the sheet contained uniform dispersion of palladium clusters having an average particle diameter of 4.5 nm.

EXAMPLE 4

The experimental procedure for the contacting treatment of the metal compound vapor with the resin sheet was substantially the same as in Example 1 except that bis (acetylacetonato)palladium(II) was replaced with bis (acetylacetonato)platinum(II). The polymeric resin sheet after completion of the contacting treatment with the metal compound vapor was subjected to a post-contacting heat treatment at 180° C. for 2 hours in another vessel under an atmosphere of nitrogen.

The thus obtained brownish black resin sheet contained 1.0% by weight of platinum. The electron microscopic examination of the sheet indicated that the sheet contained uniform dispersion of platinum clusters having an average particle diameter of 2.2 nm.

EXAMPLE 5

The experimental procedure for the contacting treatment of the metal compound vapor with the resin sheet was substantially the same as in Example 1 excepting for replacement of bis(acetylacetonato)palladium(II) with bis (acetylacetonato)copper(II) and the nylon 6 sheet with a 12 mm by 19 mm wide polyvinyl alcohol resin sheet of 0.046 mm thickness. The polymeric resin sheet after completion of the contacting treatment with the metal compound vapor was subjected to a post-contacting heat treatment at 180° C. for 24 hours in another vessel under an atmosphere of nitrogen.

The thus obtained reddish brown resin sheet contained 0.5% by weight of copper. The absorption spectrum in the visible region had an absorption band with a peak at 570 nm wavelength indicating uniform dispersion of copper clusters in the matrix of the polyvinyl alcohol.

What is claimed is:

1. A method for the preparation of a polymer-metal cluster composite which comprises the steps of:
   (a) heating and keeping a solid polymeric resin at a temperature higher than the glass transition temperature thereof; and
   (b) bringing a heavy metal compound in the form of vapor into contact with the polymeric resin kept at a temperature higher than the glass transition temperature thereof in an atmosphere of a non-oxidizing gas.

2. The method for the preparation of a polymer-metal cluster composite as claimed in claim 1 in which the temperature in step (a) is higher than the glass transition temperature of the polymeric resin by at least 5° C.

3. The method for the preparation of a polymer-metal cluster composite as claimed in claim 1 in which the heavy metal compound is a compound of a metal selected from the group consisting of iron, ruthenium, osmium, cobalt, rhodium, nickel, palladium, platinum, copper, silver and gold.

4. The method for the preparation of a polymer-metal cluster composite as claimed in claim 1 in which the heavy metal compound is an acetylacetonato complex compound of the heavy metal.

5. The method for the preparation of a polymer-metal cluster composite as claimed in claim 4 in which the acetylacetonato complex compound of a heavy metal is selected from the group consisting of bis(acetylacetonato)palladium(II), bis(acetylacetonato)platinum(II) and bis(acetylacetonato)copper(II).

6. The method for the preparation of a polymer-metal cluster composite as claimed in claim 1 in which the polymeric resin has a glass transition temperature in the range from 30° C. to 200° C.

7. The method for the preparation of a polymer-metal cluster composite as claimed in claim 1 in which the amount of the heavy metal compound is in the range from 0.01 to 40 parts by weight calculated as elementary metal per 100 parts by weight of the polymeric resin.

8. The method for the preparation of a polymer-metal cluster composite as claimed in claim 1 which further comprises, following step (b), a step of:

(c) subjecting the polymeric resin after step (b) to a heat treatment at a temperature in the range from 80 to 250° C. for 10 minutes to 50 hours in an atmosphere of a non-oxidizing gas.

* * * * *